United States Patent
Yamada et al.

(10) Patent No.: US 6,614,244 B2
(45) Date of Patent: Sep. 2, 2003

(54) SEMICONDUCTOR DEVICE INSPECTING APPARATUS

(75) Inventors: Keizo Yamada, Tokyo (JP); Yousuke Itagaki, Tokyo (JP); Takeo Ushiki, Tokyo (JP); Tohru Tsujide, Tokyo (JP)

(73) Assignee: Fab Solutions, Inc., Kanagawa (JP)

( * ) Notice: Subject to any disclaimer, the term of this patent is extended or adjusted under 35 U.S.C. 154(b) by 57 days.

(21) Appl. No.: 10/006,363

(22) Filed: Dec. 10, 2001

(65) Prior Publication Data

US 2002/0070738 A1 Jun. 13, 2002

(30) Foreign Application Priority Data

Dec. 8, 2000 (JP) .......................................... 2000-374572

(51) Int. Cl.$^7$ ............................................. G01R 31/305
(52) U.S. Cl. ........................................................ 324/751
(58) Field of Search ................................ 324/750, 751, 324/752, 753, 158.1, 73.1; 250/310, 311; 356/384; 438/14, 17, 18; 355/72, 43

(56) References Cited

U.S. PATENT DOCUMENTS 6,163,159 A * 12/2000 Seyama ....................... 324/751
6,344,750 B1 * 2/2002 Lo et al. ...................... 324/751
6,459,282 B1 * 10/2002 Nakamura ................... 324/750

* cited by examiner

*Primary Examiner*—Kamand Cuneo
*Assistant Examiner*—Jimmy Nguyen
(74) *Attorney, Agent, or Firm*—Young & Thompson

(57) ABSTRACT

A semiconductor device inspecting apparatus capable of a high-precision nondestructive inspection with a reduction of external noises, by using a value of an area having no hole as a background value for a correction when measuring an average current, measuring the current in a current differential input amplifier constitution, automatically judging whether a result of the measurement is caused by a defect of the device or of the equipment on the basis of a measured current waveform, measuring a current value of electron beams, and storing and reusing a waiting time between irradiation with electron beams and stabilization of the current measurement value.

13 Claims, 15 Drawing Sheets

Fig. 8
(a)
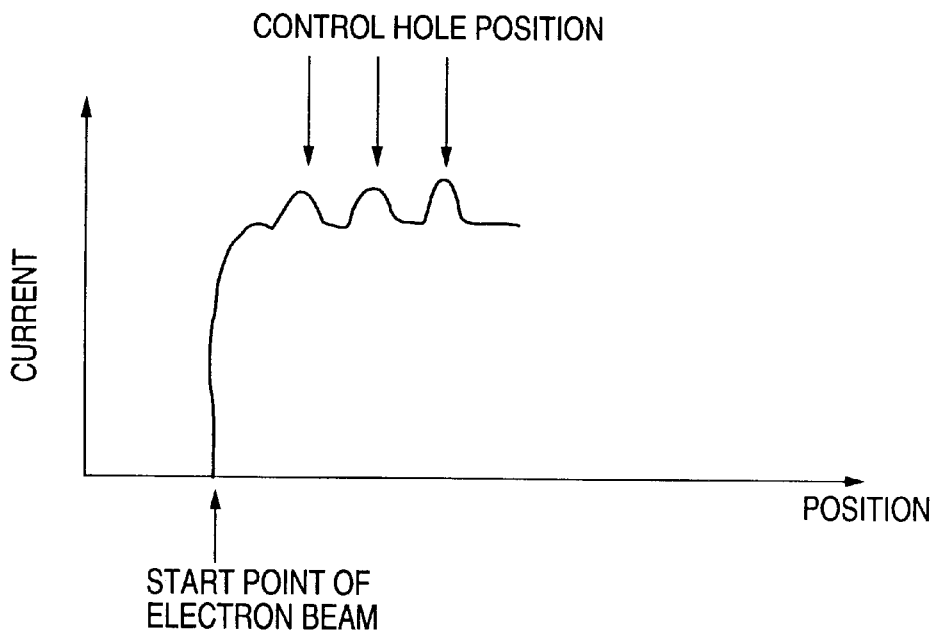
(b)
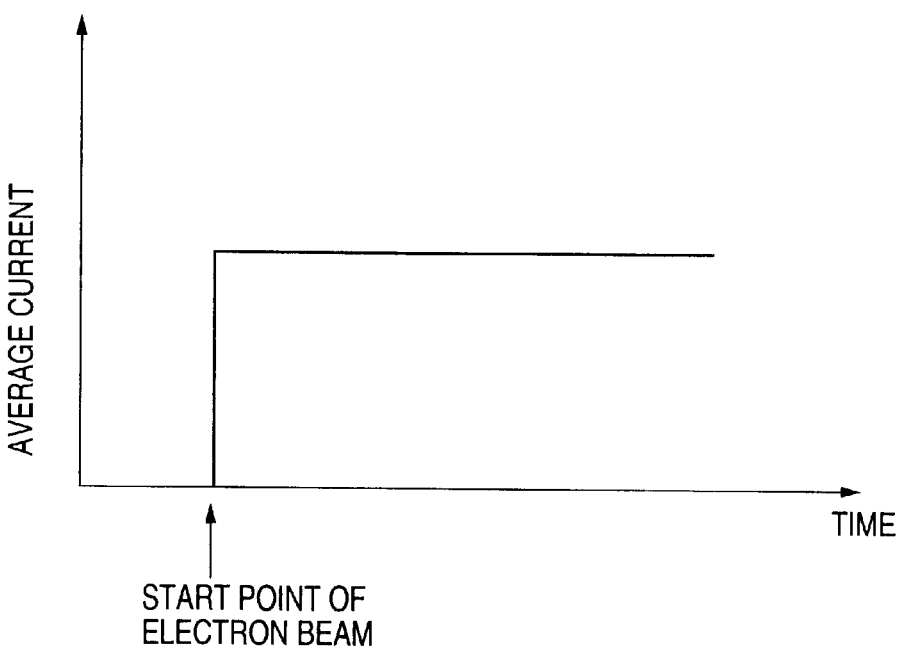

SEMICONDUCTOR DEVICE INSPECTING APPARATUS

BACKGROUND OF THE INVENTION

1. Field of the Invention

The present invention relates to an inspection of a semiconductor device in a manufacturing process, and more particularly to a semiconductor device inspecting apparatus for judging whether a semiconductor device is good or bad by measuring a current which flows in such a way that it compensates for a secondary emission caused by electron beams which have passed through contact holes and reached a substrate when the semiconductor device in a manufacturing process is irradiated with the electron beams.

2. Related Background Art

There are the following known examples of techniques for measuring a current, which flows in such a way that it compensates for a secondary emission caused by electron beams, which have passed a contact hole and reached a substrate when the semiconductor device in a manufacturing process is irradiated with the electron beams. In Application Ser. No. 09/057,455, there is disclosed detecting a current caused by electron beams which have passed through a contact hole and reached a substrate and detecting a position or a size of a bottom of the contact hole as shown in FIG. 1 and FIG. 2. In addition, in Application Ser. No. 09/451,440, as shown in FIG. 3, there is disclosed irradiating an area including a plurality of contact holes with electron beams and measuring compensation current values on the substrate generated by the electron beams passing through the contact holes to check the ratio of normal contact holes in the area. Furthermore, in Application Ser. No. 09/702,831, as shown in FIG. 4, there is disclosed an inspection method for determining a good or bad product by measuring waveforms of different chips and comparing them with a reference value by a subtraction. Still further, as shown in FIG. 5, there is shown a method of extracting an extrapolating D.C. component by irradiating repeatedly with electron beams in different scanning frequencies and measuring current waveforms in order to remove capacitance components generated by electron beam scanning. In Application Ser. No. 09/722,074, as shown in FIG. 6, there is disclosed a method of making etching conditions by comparing measured compensation currents using trial samples formed under different etching conditions.

In the prior arts set forth hereinabove, the current generated by electron beams applied to an object to be measured is used as compensation current generated by directly irradiating a semiconductor substrate at the bottom of the contact holes. While a measured current value is minute from the beginning as a picoampere or lower, a microstructure and a high precision are accelerated in a measured portion, thereby causing a demand for a further improvement of a measurement precision. In addition, the current value measured is minutely a picoampere or lower as described in the above and therefore there is a defect of a current variation caused by an effect of a stray capacitance according to measuring conditions or measuring equipment. Furthermore, an electron beam source is designed so as to operate very stably as measuring equipment, by which a variation per day is only 1% or so, which is not a problem in a normal usage. If, however, contact holes condition is checked by electron beam scanning, the current variation itself is about 1% and therefore an error occurs in a measurement value of the compensation current only by a weak fluctuation of the electron beam current. As causes of the beam current fluctuation, there can be a temperature change of the beam source, deterioration with age of the beam source, a variation of power supplied to the beam source. Furthermore, there is a problem that the obtainable waveform requires much time to enter a steady state since an LCR value depends upon an apparatus or a wafer and therefore it takes much time for an analysis of whether the measurement value can be adopted. Besides, for determining whether an apparatus is normally operating or whether the measured waveform is reliable, the determination is difficult in some cases only by a waveform measured once.

An object of the present invention is to solve these problems and to provide a semiconductor device inspecting method that enables a high-precision nondestructive inspection with a reduction of external noises.

SUMMARY OF THE INVENTION

The prior arts set forth hereinabove are basically for measuring a current which flows in such a way that it compensates for a secondary emission caused by an irradiation with electron beams. Therefore, the measured current value is minutely a picoampere or lower, by which the measurement value may be affected by measuring conditions, a structure or material of a semiconductor device to be measured, or a time constant of measuring equipment.

It is an object of the present invention to solve this problem and to provide a semiconductor device inspecting apparatus capable of a high-precision nondestructive inspection with a reduction of external noises.

According to a first aspect of the present invention, there is provided a semiconductor device inspecting apparatus, comprising: an electron gun for irradiating a area on a sample with electron beams to be inspected where a semiconductor device is formed, an electron beam control section for controlling these electron beams, current measuring equipment for measuring compensation current of secondary electrons generated by electron beams which have passed through contact holes in the inspected area and reached an underlying conductive layer, a data processor for determining a reference for judging whether an inspected area is good or bad, which is a current value obtained by using the current measuring equipment when irradiating an area having one or more contact holes treated as the inspected area sequentially or collectively with electron beams, and a storage device for storing the data processing result, wherein the storage device stores a background value, which is a current value obtained when irradiating an area made of the same material and having the same structure except that it has no contact hole in the same sample as the area having the contact holes in the inspected area and the data processor performs data processing of subtracting the background value stored in the storage device from the current value obtained by using the current measuring equipment when irradiating the area having one or more contact holes treated as the inspected area. Therefore, there is provided a semiconductor device inspecting apparatus, comprising: an electron gun for irradiating a area on a sample with electron beams to be inspected where a semiconductor device is formed, an electron beam control section for controlling these electron beams, current measuring equipment for measuring compensation current of secondary electrons generated by electron beams having reached an underlying conductive layer in the inspected area, a data processor for determining a reference for judging whether an inspected area is good or bad, which is a current value obtained by using the current measuring equipment when irradiating an area having one or more contact holes treated as the inspected area sequentially or collectively with electron beams, and a storage device for storing the data processing result, wherein the storage device stores the current value of the electron beams having reached the inspected area from the electron gun emitting the electron beams after a beam measurement with a detector and the data processor corrects the current value obtained by using the current measuring equipment when irradiating the area having one or more contact holes treated as an inspected area sequentially or collectively with electron beams on the basis of the measurement value of the beam measurement. It is effective if there is a relatively small difference between the current value of an area where the contact holes are formed and the current value of the area where no contact hole is formed such as a case of an extremely small contact hole density of the area to be inspected depending upon a thickness or a type of an insulating film, thereby enabling a calculation of compensation current flowing in the semiconductor substrate from which the background value is subtracted.

According to a second aspect of the present invention, there is provided a semiconductor device inspecting apparatus, comprising: an electron gun for irradiating a area on a sample with electron beams to be inspected where a semiconductor device is formed, current measuring equipment for measuring compensation current of secondary electrons generated by electron beams having reached an underlying conductive layer in the inspected area, a data processor for determining a reference for judging whether an inspected area is good or bad, which is a current value obtained by using the current measuring equipment when irradiating an area having one or more contact holes treated as the inspected area sequentially or collectively with electron beams, and a storage device for storing the data processing result, wherein the current measuring equipment has a first current/voltage exchanger connected to electrodes on which the sample is placed, a second current/voltage exchanger connected to opposite electrodes arranged in the vicinity of the sample to be inspected, and a differential amplifier for determining a difference between a measurement value of the first current/voltage exchanger and a measurement value of the second current/voltage exchanger and wherein the differential amplifier is connected to the data processor. According to this constitution, the opposite electrodes are capable of canceling an effect of a stray capacitance, by which a microcurrent can be measured.

According to a third aspect of the present invention, there is provided a semiconductor device inspecting apparatus, comprising: an electron gun for irradiating a area on a sample with electron beams to be inspected where a semiconductor device is formed, an electron beam control section for controlling these electron beams, current measuring equipment for measuring compensation current of secondary electrons generated by electron beams having reached an underlying conductive layer in the inspected area, a data processor for determining a reference for judging whether an inspected area is good or bad, which is a current value obtained by using the current measuring equipment when irradiating an area having one or more contact holes treated as the inspected area sequentially or collectively with electron beams, and a storage device for storing the data processing result, wherein the data processor compares a current waveform obtained by using the current measuring equipment with a standard waveform previously stored in the storage device as a standard waveform when irradiating the predetermined area having one or more contact holes on the semiconductor device with electron beams by using the electron gun and, if the comparison result exceeds the predetermined range, determines whether it is caused by a defect of the inspected area or of the inspecting apparatus. According to this constitution, it is possible to determine automatically whether the excess is caused by a defect of the inspecting apparatus such as an abnormality of the current/voltage exchanger easy to oscillate due to high amplitude or by an abnormality of the inspected area of the semiconductor device.

In addition, the standard waveform has a transient waveform pattern including overshoots at a rising edge and a falling edge of the waveform and a damped oscillation which follows thereafter; if the comparison result exceeds a predetermined range, it is determined to be an abnormality of the inspecting apparatus, and if the comparison result is within the predetermined range, it is determined to be an abnormality of the semiconductor device to be inspected. The data processor may include a data processor, which determines a defect of the device when the comparison result exceeds the predetermined range. In this condition, the comparison means makes a comparison in one or more of the rise time, an overshoot amount, an overshoot period, a flat period, an undershoot amount, an undershoot period, a zero-point offset, and a frequency analysis value of the waveform.

According to a fourth aspect of the present invention, there is provided a semiconductor device inspecting apparatus, comprising: an electron gun for irradiating a area on a sample with electron beams to be inspected where a semiconductor device is formed, an electron beam control section for controlling these electron beams, current measuring equipment for measuring compensation current of secondary electrons generated by electron beams having reached an underlying conductive layer in the inspected area, a data processor for determining a reference for judging whether an inspected area is good or bad, which is a current value obtained by using the current measuring equipment when irradiating an area having one or more contact holes treated as the inspected area sequentially or collectively with electron beams, and a storage device for storing the data processing result, wherein the storage device stores a current value of the electron beams having reached the inspected area from the electron gun for irradiating the electron beams by using a detector for a beam measurement of the current value and the data processor corrects the current value obtained by using the current measuring equipment when irradiating an area having one or more contact holes treated as the inspected area sequentially or collectively with electron beams on the basis of the measurement value of the beam measurement. Therefore, even if the electron beams fluctuate due to a temperature change of the beam source, deterioration with age of the beam source, a variation of power supplied to the beam source, the detector measures the beams and corrects the measured current, by which an accurate measurement value is obtained.

Preferably the detector includes a detector such as, for example, a Faraday cup, arranged in an electron beam irradiation position instead of a sample to be inspected at one or more of the time points before, during, and after the inspection of the sample to be inspected or before, during, or after the inspection of an individual inspected area on the sample to be inspected.

According to a fifth aspect of the present invention, there is provided a semiconductor device inspecting apparatus, comprising: an electron gun for irradiating a area on a sample with electron beams to be inspected where a semiconductor device is formed, an electron beam control section for controlling these electron beams, current measuring equipment for measuring compensation current of secondary electrons generated by electron beams having reached an underlying conductive layer in the inspected area, a data processor for determining a reference for judging whether an inspected area is good or bad, which is a current value obtained by using the current measuring equipment when irradiating an area having one or more contact holes treated as the inspected area sequentially or collectively with electron beams, and a storage device for storing the data processing result, wherein the data processor reads and processes a current value in an area where the current is stabilized after the irradiation with the electron beams among measurement values obtained by using the current measuring equipment. Even if an LCR value of the obtainable waveform depends upon an apparatus or a wafer, an area in which the waveform is in the steady state is previously stored and the current value is read in the stabilized area, thereby preventing a time loss caused by re-measurement.

For an inspection of the same sample to be inspected in another inspected area or of another sample of the same type to be inspected, the apparatus preferably includes means for reading the current value after an elapse of a waiting time stored in the storage means after the irradiation with the electron beams.

BRIEF DESCRIPTION OF THE DRAWINGS

FIGS. 8(a) and 8(b) are graphs showing examples of compensation current waveforms measured correspondingly to a scanning position at scanning electron beams thinner than a hole diameter;

DETAILED DESCRIPTION OF THE PREFERRED EMBODIMENTS

Figure 1:
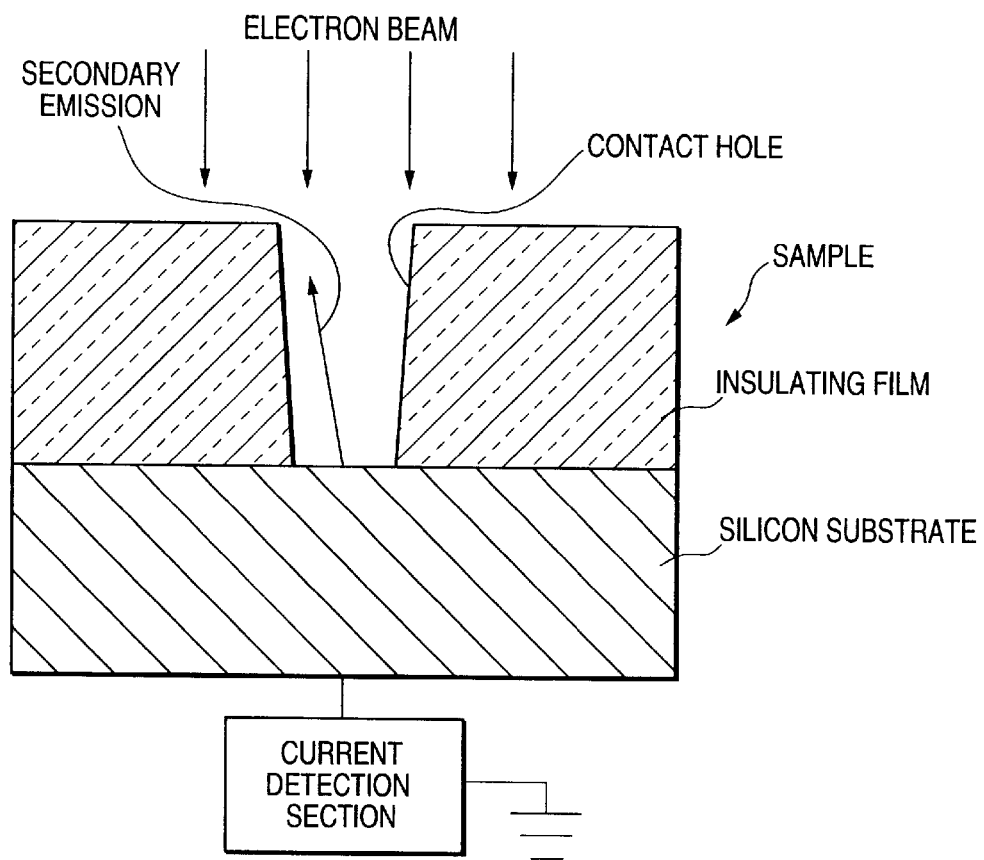
FIG. 1 is a diagram according to a prior art showing compensation current which flows when a contact hole is irradiated with electron beams.
Figure 2:
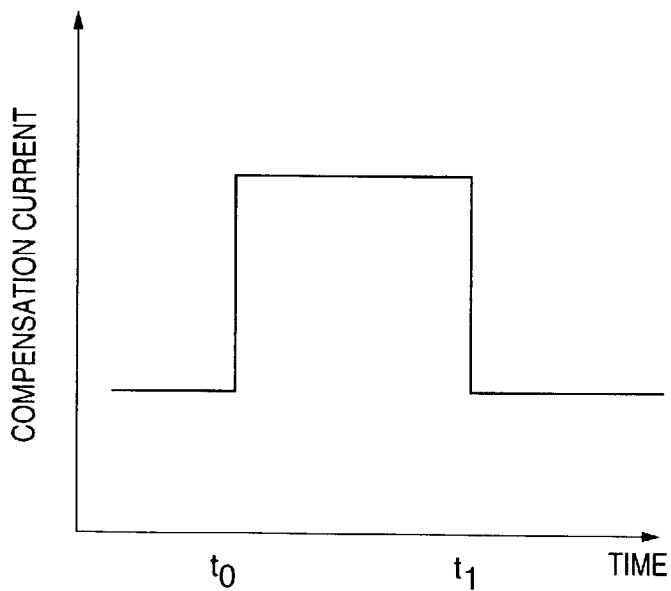
FIG. 2 is a diagram according to a prior art showing an amount of a current which flows when electron beams are applied between time to to time $t_1$ according to the prior art.
Figure 3:
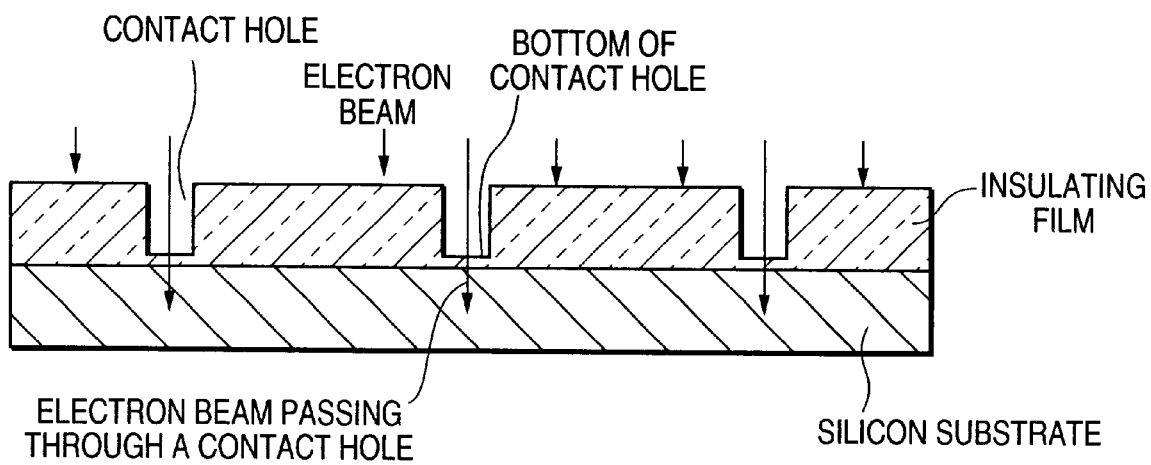
FIG. 3 is a diagram according to a prior art showing a case of irradiating an area having a plurality of holes with electron beams collectively.
Figure 4:
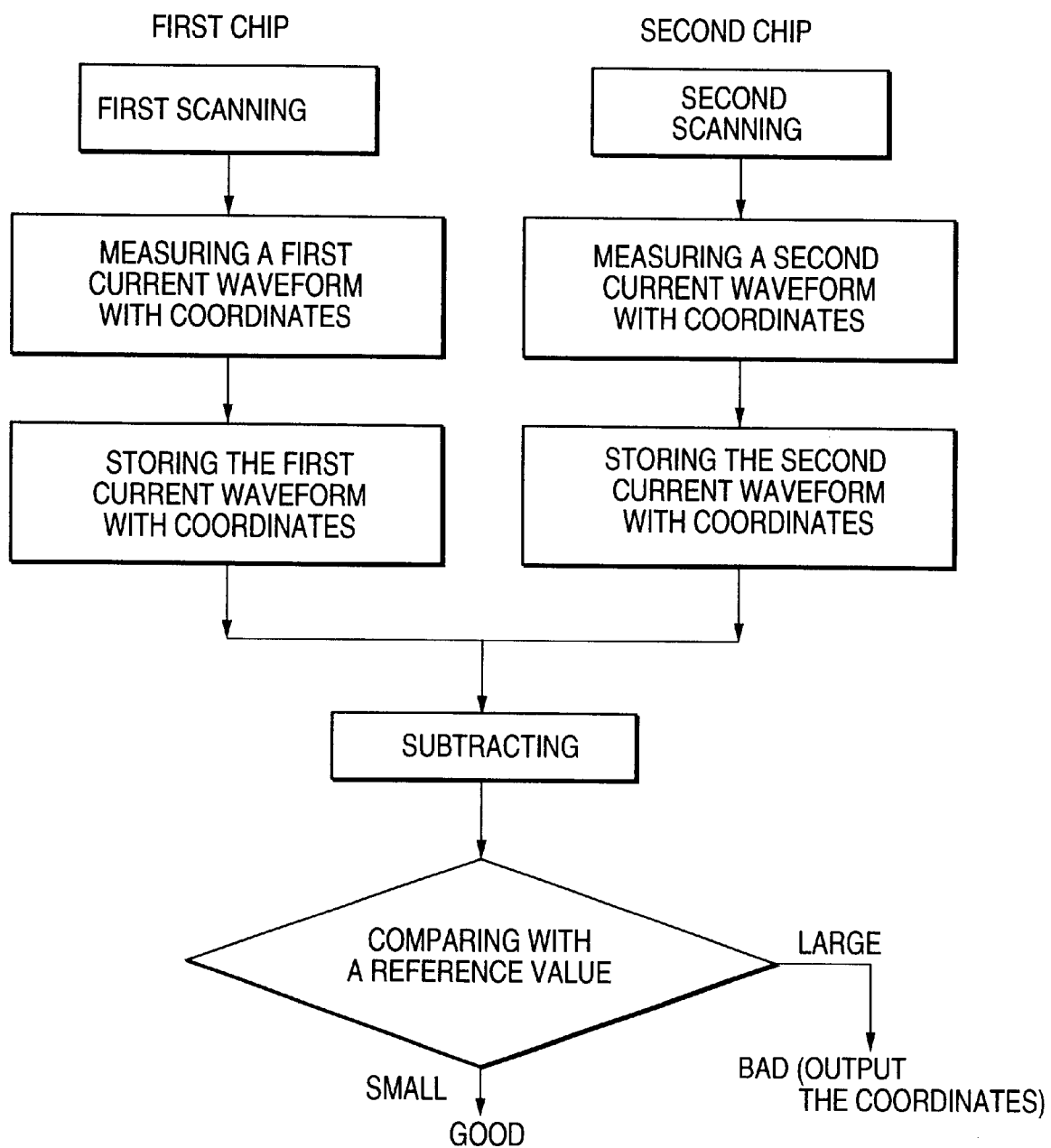
FIG. 4 is a flowchart according to a prior art for a semiconductor device inspection with a correction by measuring a plurality of chips.
Figure 5:
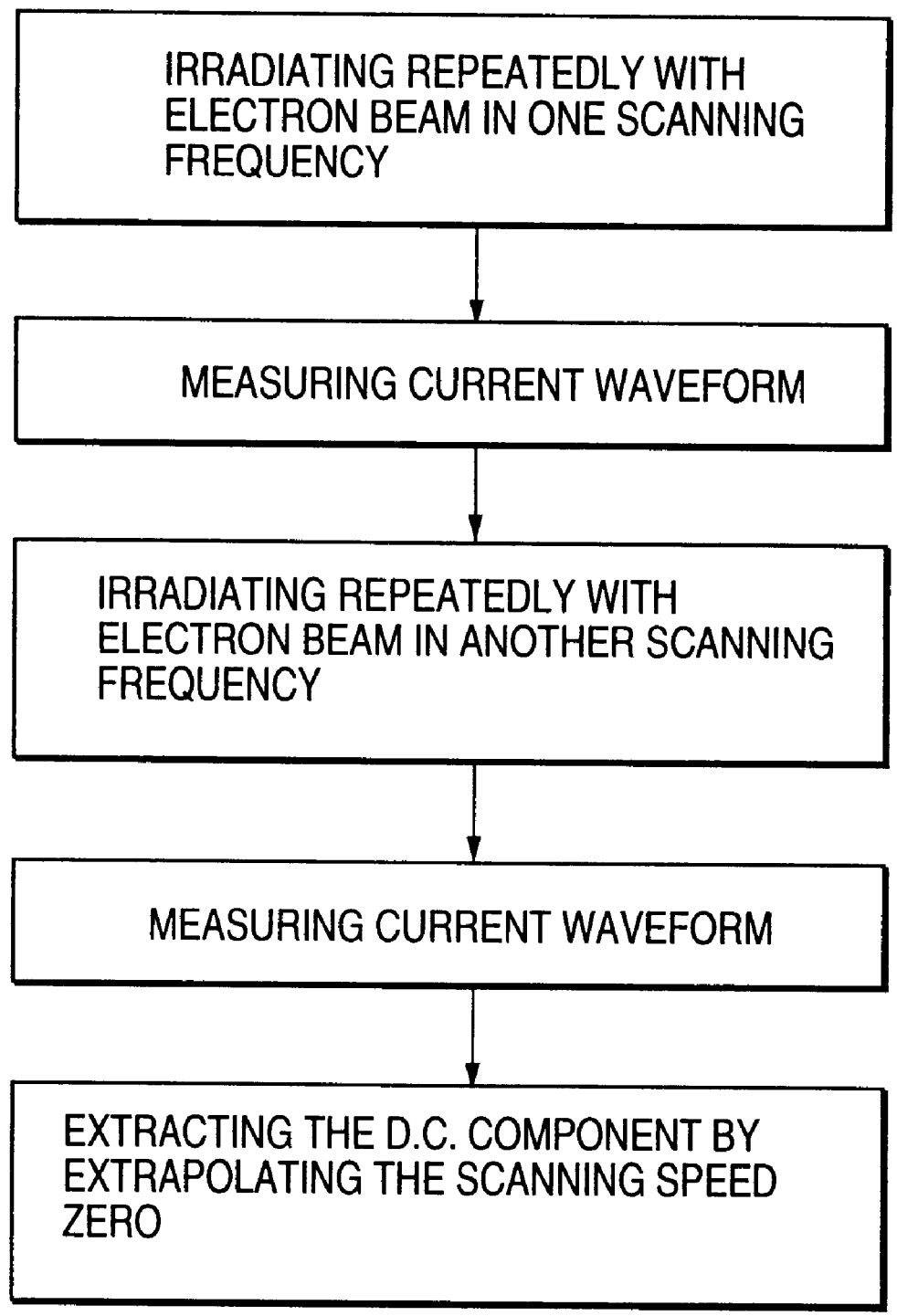
FIG. 5 is a flowchart according to a prior art of measuring current waveforms at different scanning frequencies of electron beams and extracting the D.C. component by extrapolation.
Figure 6:
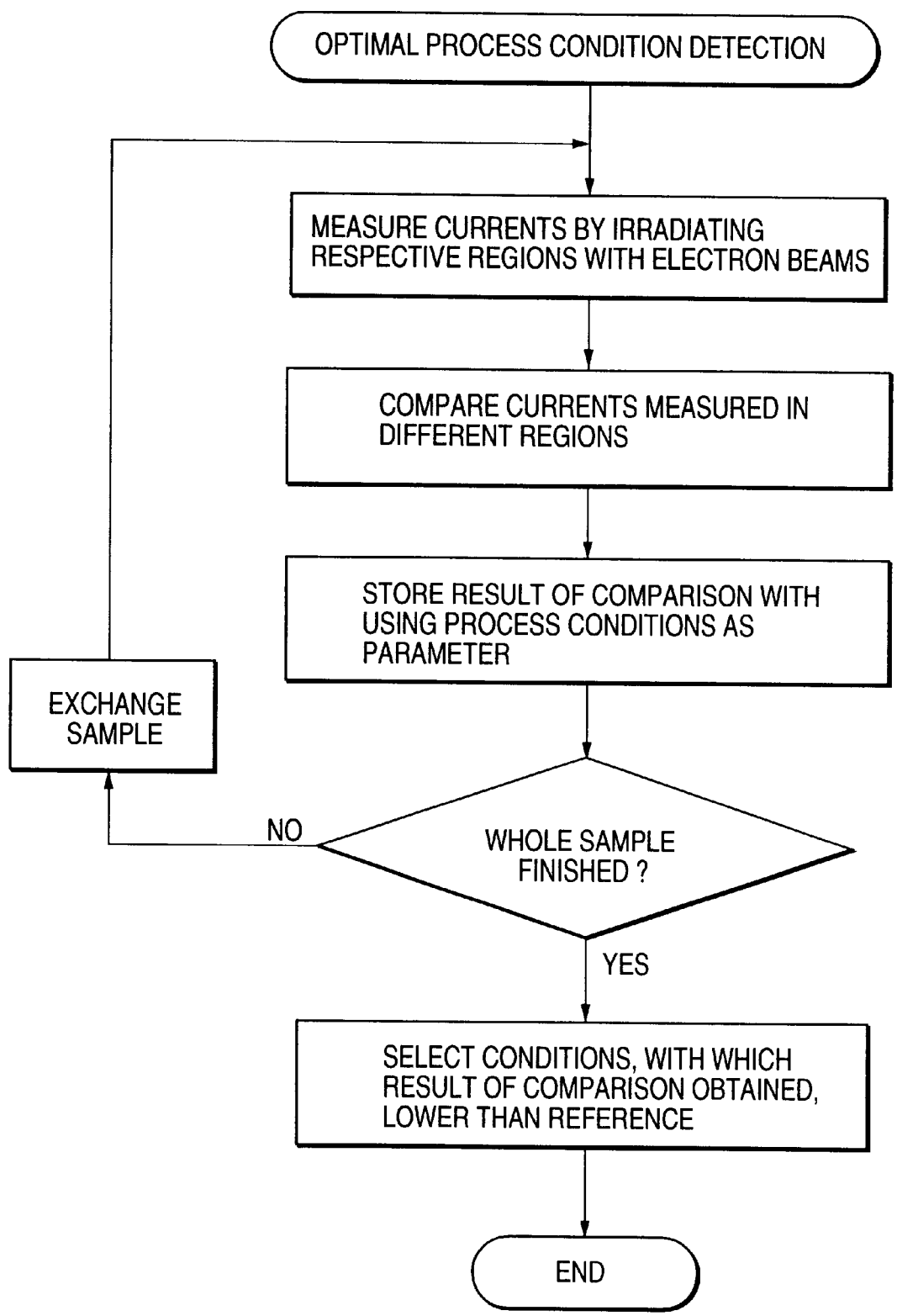
FIG. 6 is a flowchart according to a prior art of comparing current amounts measured in different areas for making etching conditions with each other and selecting conditions satisfying a predetermined reference.
Figure 7:
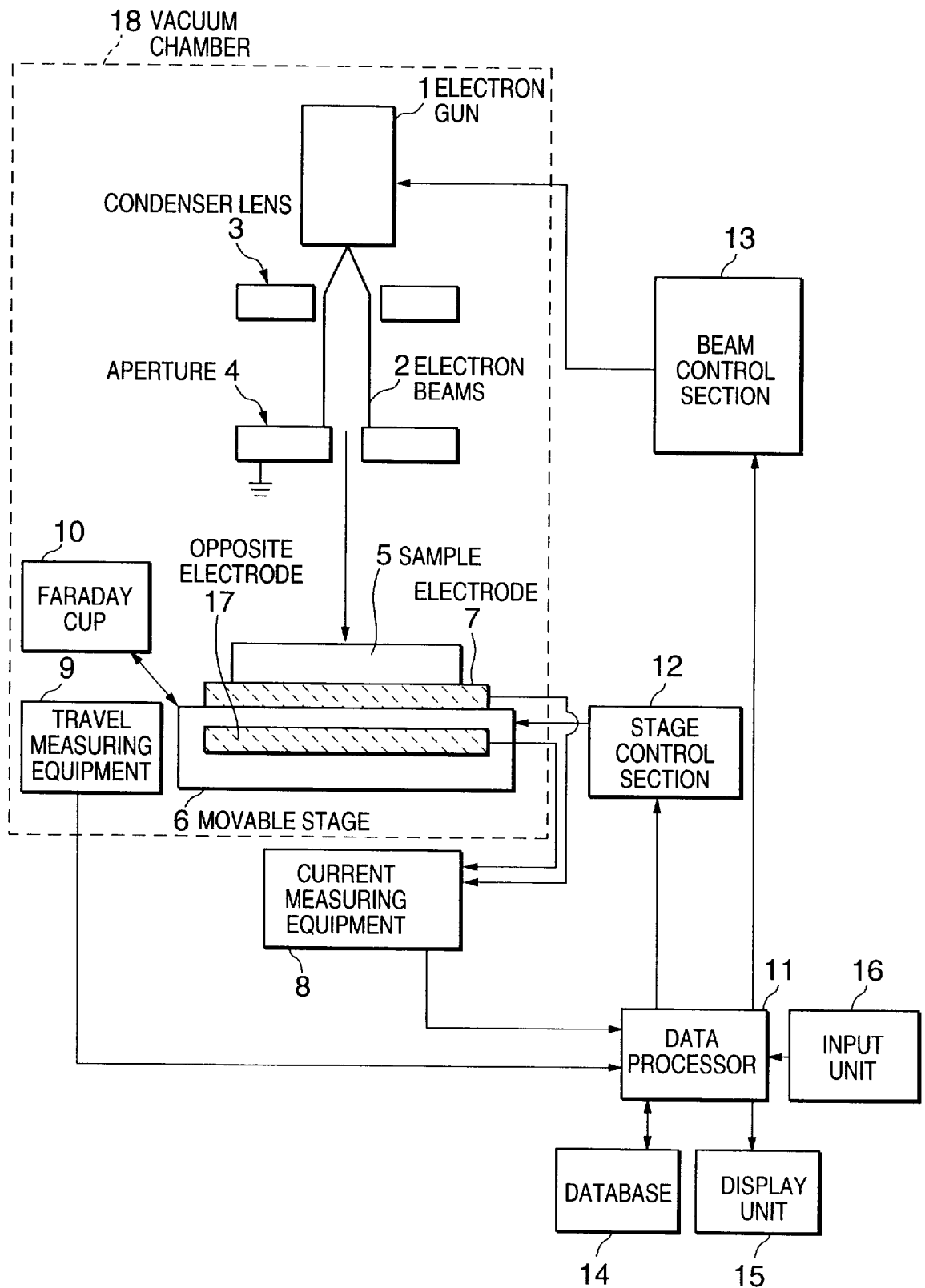
FIG. 7 is a block constitutional diagram showing an embodiment of the present invention.

Referring to FIG. 7, there is shown a block constitutional diagram illustrating an embodiment of an inspecting apparatus according to the present invention. This apparatus comprises an electron gun 1 for emitting electron beams 2, a condenser lens 3 for paralleling electron beams, an aperture 4 for regulating a beam shape, a movable stage 6 for holding a sample (wafer) to be inspected where a semiconductor device is formed and for determining an inspected area and scanning an irradiated position of the electron beams 2 by moving the sample to be inspected 5, an electrode 7 and current measuring equipment 8 for measuring current generated on an underlying conductive layer in the inspected area by electron beams having reached the conductive layer, travel measuring equipment 9 for measuring a travel of the movable stage 6, a sample to be inspected 5, a Faraday cup 10 for measuring a current value of electron beams instead of the movable stage 6 and the electrode 7, a data processor 11 such as a computer for performing data processing of a result of the measurement of the current measuring equipment 8 and controls for an inspection, a stage control section 12 for controlling a movement of the movable stage 6, and a beam control section 13 for controlling changes of an accelerating voltage or changes of an irradiation period of the electron beams.

The electron beams 2 emitted from the electron gun 1 is once converted to parallel electron beams by the condenser lens 3 and then applied to the aperture 4 provided with an extremely small hole. The aperture 4 is made of a conductor such as a metal and grounded to prevent electrons applied to the aperture 4 from accumulating on the aperture 4. The electron beams 2 which have passed through the aperture 4 become a very thin beam having almost the same size as regulated by the aperture 4 and is applied to the sample to be inspected 5. To prevent a diameter change of the aperture caused by heating, the apparatus may be configured to cool the aperture.

The sample to be inspected 5 is put on the electrode 7 for collecting current and the electrode 7 is put on the movable stage 6. In the vicinity of the movable stage 6, there is arranged the travel measuring equipment 9 for measuring the travel of the movable stage 6 precisely in an angstrom order on the basis of a theory of an interferometer or the like. While optical equipment is generally used as the travel measuring equipment 9, it is also possible to use equipment based on a theory of detecting a physical quantity, which depends upon a distance such as equipment using electromagnetic waves, electric resistances, or capacities or equipment utilizing a quantum mechanical effect.

The sample to be inspected 5 and the electrode 7 may be arranged in contact with each other so that current is enabled to flow directly between them, or if the electron beams applied to the sample to be inspected 5 are modulated at high frequencies, the current can be measured by capacity coupling and therefore the electrode 7 may only be adjacent to the sample to be inspected 5. Generally in a semiconductor manufacturing process, a local oxide film for separating elements is often formed on the rear surface of the substrate and therefore the wafer has an insulating film formed on its rear surface in most cases. In such a case, a use of a capacity coupling stage is effective to make a contact between the sample to be inspected 5 and the movable stage 6. Otherwise, they can be coupled by utilizing the side of the sample to be inspected 5.

The contact holes to be measured are fine in their size and therefore the sample to be inspected 5 need be placed flatly on the movable stage 6. To fulfill this requirement, it is effective to press an outer periphery of the sample to be inspected 5 by using a ring jig, for example.

The current collected by the electrode 7 is measured by using the current measuring equipment 8. A result of the measurement is converted to digital signals and outputted to the data processor 11. The data processor 11 is capable of performing various types of data processing and particularly checking that contact holes or via holes on the inspected area on the sample to be inspected 5 are favorably formed. The data processor 11 is connected to a database 14 for storing obtained data so that the data can be fetched out if necessary, a display unit 15 for displaying an output, and an input unit 16 for inputting stage controls, electron beam controls, and data processing programs.

When a wafer is inspected, it takes much time to inspect all chips on the wafer or all areas on the wafer due to a problem of a time constant of a measuring system accompanying a measurement of a scanning speed and a microcurrent. While it may be needed in a stage previous to a mass production, it cannot be used for an inline inspection at the mass production. Therefore, it is considered to irradiate an area of a certain size having a plurality of holes collectively with electron beams and to measure the current as an average. In this condition, a low average current means a small number of normal holes in the area, by which it is possible to determine whether the area is good or bad.

Referring to FIGS. 8(a) and 8(b), there are shown examples of current waveforms measured for contact holes inspection.

FIG. 8(a) illustrates a compensation current waveform measured correspondingly to a scanning position at scanning with electron beams each of which is thinner than a hole diameter and FIG. 8(b) illustrates a compensation current waveform at irradiating an area having a plurality of holes collectively with a thick electron beam. Scanning with thin electron beams enables an increase of the compensation current to be observed according to hole positions as shown in FIG. 8(a), by which it is understood whether the holes are correctly etched. On the other hand, if a relatively wide area is irradiated collectively with an electron beam, as shown in FIG. 8(b), compensation current corresponding to a total area of the contact hole bottom is observed during the irradiation with the electron beam. The observed compensation current is standardized by the number of holes in the area obtained by using the CAD data, by which an average current per hole is obtained.

If the average current is measured, a large amount of current may flow in an area having no hole according to a material or a structure of the sample to be measured. In this case, the current in the contact hole area hidden by the background disables an accurate measurement. Means for correcting the background will be described below.

Figure 9:
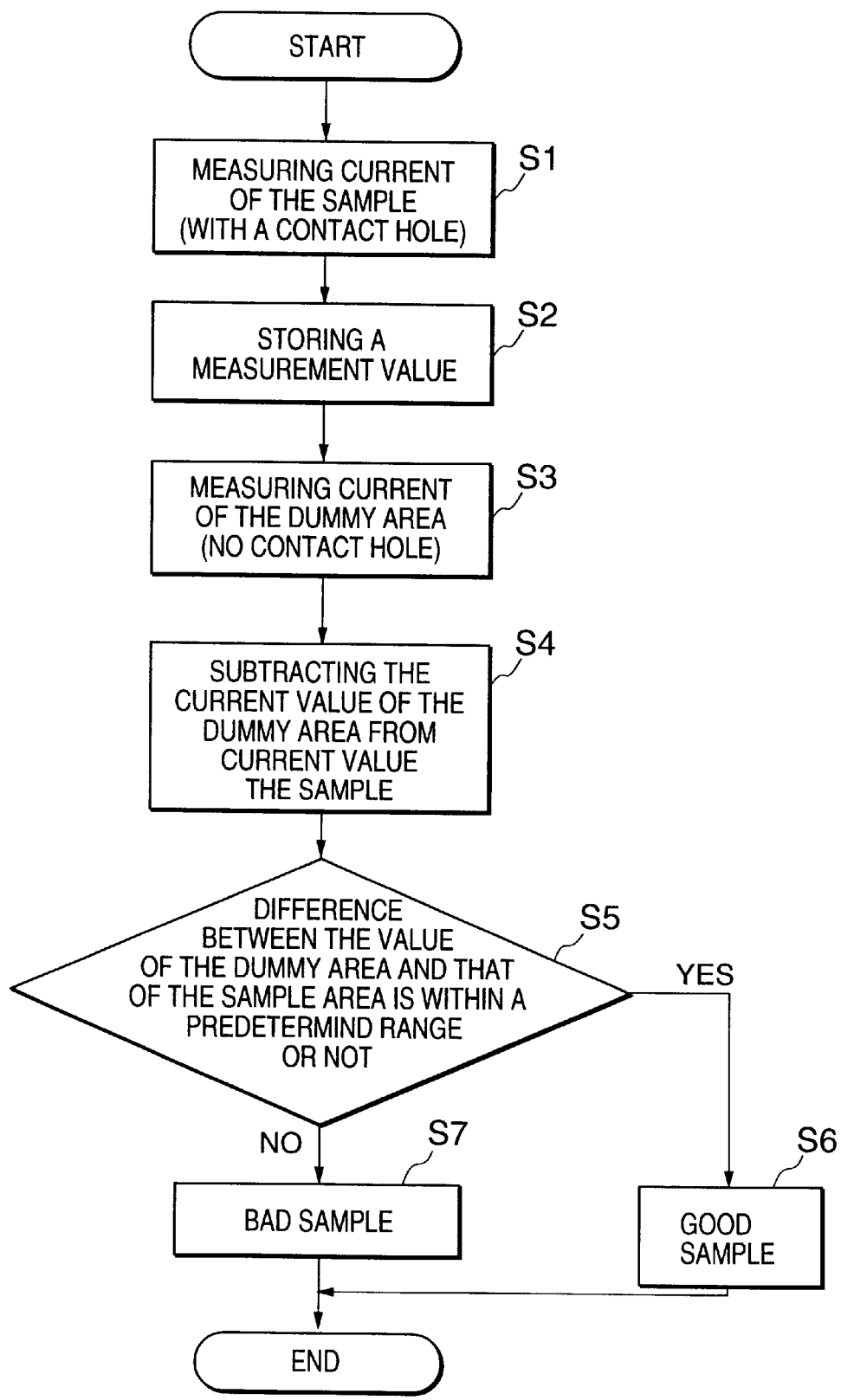
FIG. 9 is a flowchart of a device inspection including a background correction procedure.

Referring to FIG. 9, there is shown a flow of a device inspection including a background correction procedure. With a reference to FIG. 7 and FIG. 9, an area having one or more holes on the sample to be inspected 5 is set to an inspected area first and then the movable stage 6 is controlled by the stage control section 12 so that the area is irradiated sequentially or collectively with the electron beams 2 from the electron gun 1. The data processor 11 reads (S1) and stores (S2) a measurement value of the current measuring equipment 8 at this point. Subsequently, a dummy area, which is made of the same material having the same structure except that it has no contact hole, is selected in the same sample to be inspected 5 and then measured under the same conditions (S3). The data processor 11 reads the measurement value obtained from the dummy area as a background value and subtracts it from the measurement value obtained from the inspected area (S4). The data processor 11 further determines whether the difference between the value of the dummy area and that of the sample area is within a predetermined range; if it is so, the inspected area is considered to be good (S6). If the difference exceeds the predetermined range, it is considered that the area is defective due to an incorrect contact hole formation (S7).

While the inspected area is measured first in this embodiment, the dummy area may be measured first. In addition, measurement values obtained from a plurality of inspected areas may be corrected by background values obtained from a single dummy area.

Figure 10:
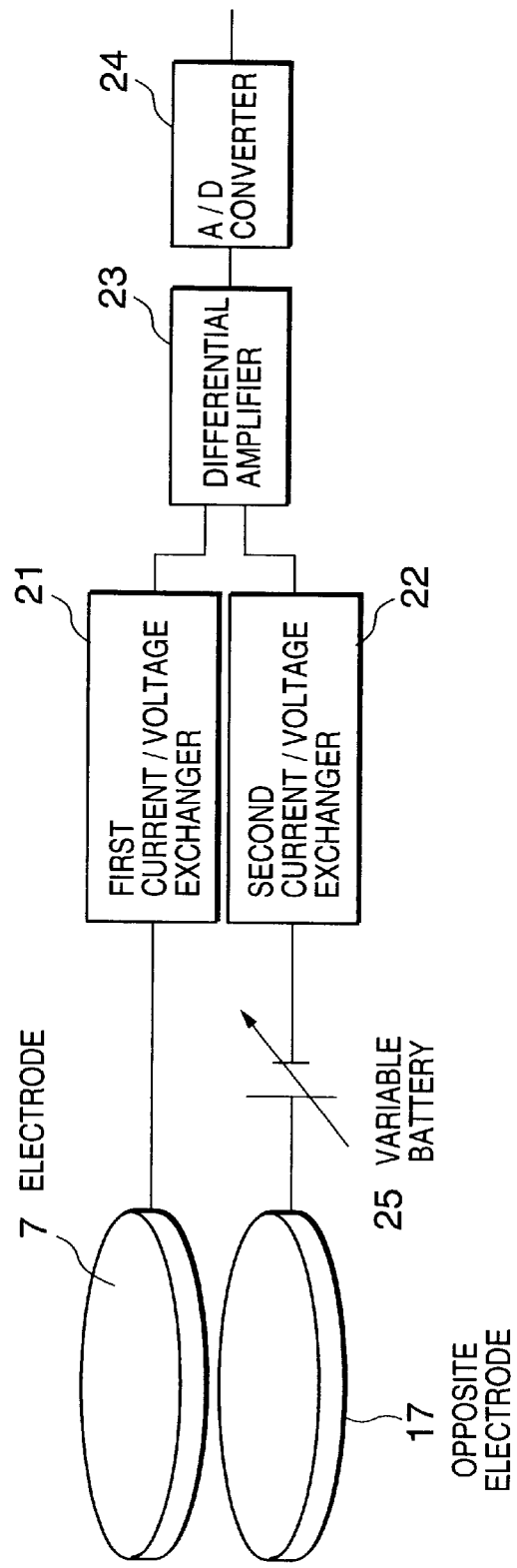
FIG. 10 is a block constitutional diagram showing details of current measuring equipment.
Figure 11:
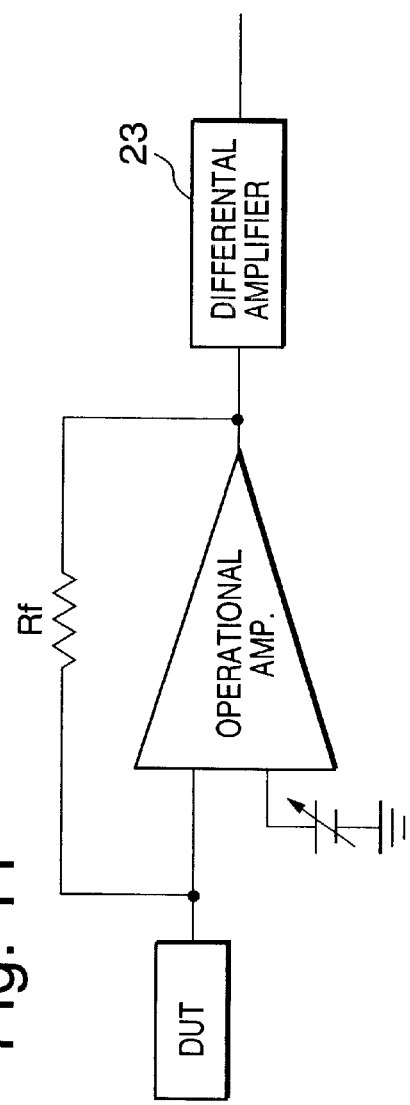
FIG. 11 is a block diagram of a current/voltage exchanger.

Referring to FIG. 10, there is shown equipment comprising a first current/voltage exchanger 21 connected to the current measuring electrode 7, a second current/voltage exchanger 22 connected to the opposite electrode 17 arranged in the vicinity of the measuring semiconductor device, a differential amplifier 23 for determining a difference between output voltages between the current/voltage exchangers 21 and 22, and an A/D converter 24 connected to the differential amplifier 23 and the data processor. These two current/voltage exchangers 21 and 22 have the same performance and their constitution is shown in FIG. 11. It comprises an operational amplifier and a high-resistance $R_f$, which is capable of converting current of 10 pA to a voltage of 1V or so. While the current/voltage exchanger singly exchanges the compensation current generated on the sample and noise current generated by a stepping motor or the like of the travel measuring equipment to a voltage, the differential amplifier subtracts noise current which has been caught if an opposite electrode is arranged in the vicinity of the semiconductor device measuring electrode 7, by which only compensation current can be measured in the latter arrangement. The differential amplifier 23 can set a gain or an offset from the data processor 11, thereby enabling an accurate measurement of a difference of an output voltage between these two current/voltage exchangers 21 and 22.

Irradiation with electron beams requires a high vacuum condition, the sample to be inspected 5, the movable stage 6, and the electrode 7 shown in FIG. 7 are arranged in a single vacuum cabinet together with the travel measuring equipment 9 and the Faraday cup 10. In spite of an existence in this vacuum cabinet, the sample is affected by electromagnetic induction from the travel measuring equipment or the stepping motor and the secondary electron collection. Therefore, an opposite electrode 17 as a common board is also arranged in this cabinet. The opposite electrode 17 may be the cabinet itself. The current/voltage exchangers 21 and 22 themselves can be noise sources and therefore they are arranged outside the cabinet here. Considering effects of noises, connection lines are preferably short between the electrode 7 or the opposite electrode 17 and the current/voltage exchanger 21 or the current/voltage exchanger 22. In some cases, at least a part of the current/voltage exchangers may be arranged inside the cabinet.

In addition, inserting an electrode bias source between the current measuring electrode 7 and the current/voltage exchanger 21, the electrode bias can be applied to a substrate or a conductive layer of the sample to be inspected via the electrode 7.

Although an abnormal result of the measurement is normally associated with a defect of the inspected sample, actually the inspecting apparatus may be defective. How to discriminate between them is described below.

Figure 12:
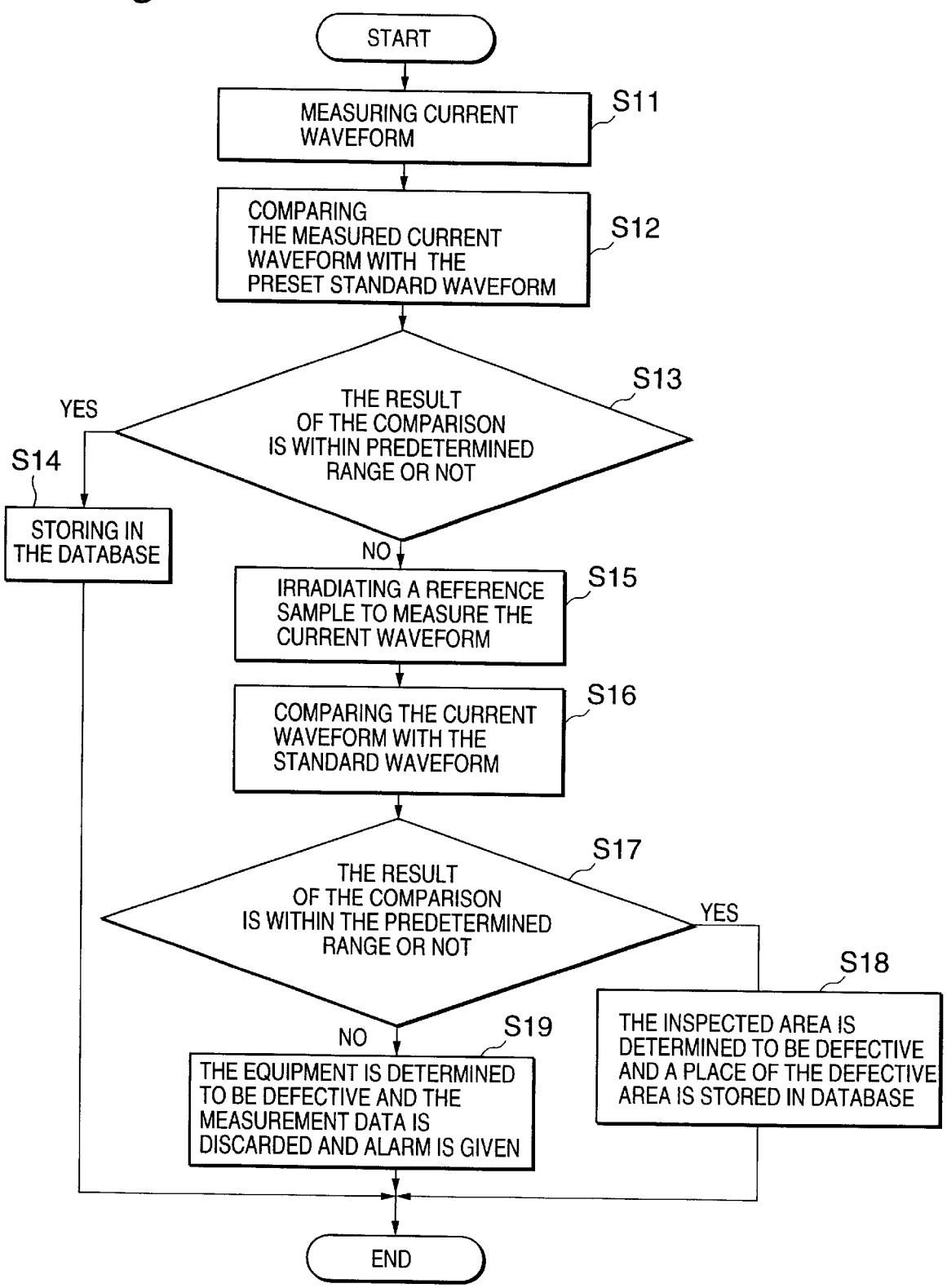
FIG. 12 is a flowchart of a device inspection including a procedure for detecting an equipment defect.

Referring to FIG. 12, there is shown a flow of a device inspection including a procedure of detecting a defect of the apparatus. While conventionally a current value is measured and the waveforms are individually checked, the apparatus in this application automatically performs these operations. First, the current waveforms in the preset inspected area are measured first (S11). The data processor 11 (See FIG. 7) compares the measured current waveform with the preset standard waveform (S12); if a result of the comparison is within the predetermined range (S13), the inspected area is considered to be good and the measured current waveform is stored in the database (S14). If the result of the comparison with the standard waveform exceeds the predetermined range, the data processor 11 outputs control signals to the stage control section 12 and the beam control section 13, irradiates a reference sample with electron beams to measure the current waveform (S15), and compares the current waveform with the standard waveform (S16). If the result of the comparison is within the predetermined range (S17), the inspected area is determined to be defective and a place of the defective area is stored in the database (S18). If a result of the comparison between the current waveform of the reference sample and the standard waveform exceeds the predetermined range, the equipment is determined to be defective and therefore the measurement data is discarded and an alarm is given (S19).

The measured current waveform is compared with the standard waveform by means of a correlation between two waveforms (pattern matching).

The reference sample may be previously known to be good or an inspection pattern attached to the stage may be used as a reference sample.

Figure 13:
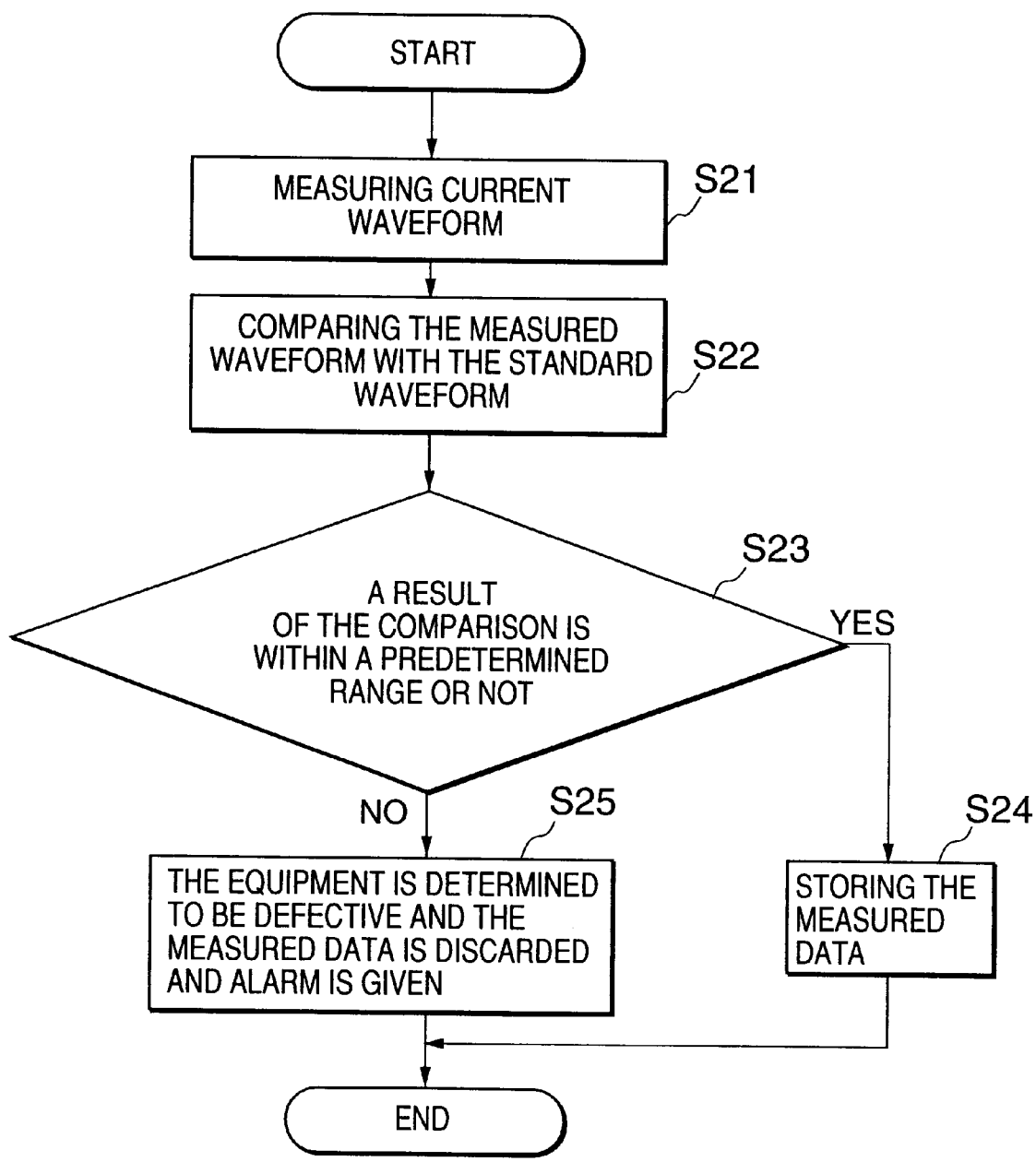
FIG. 13 is a diagram showing a standard waveform and an actual measurement waveform.
Figure 14:
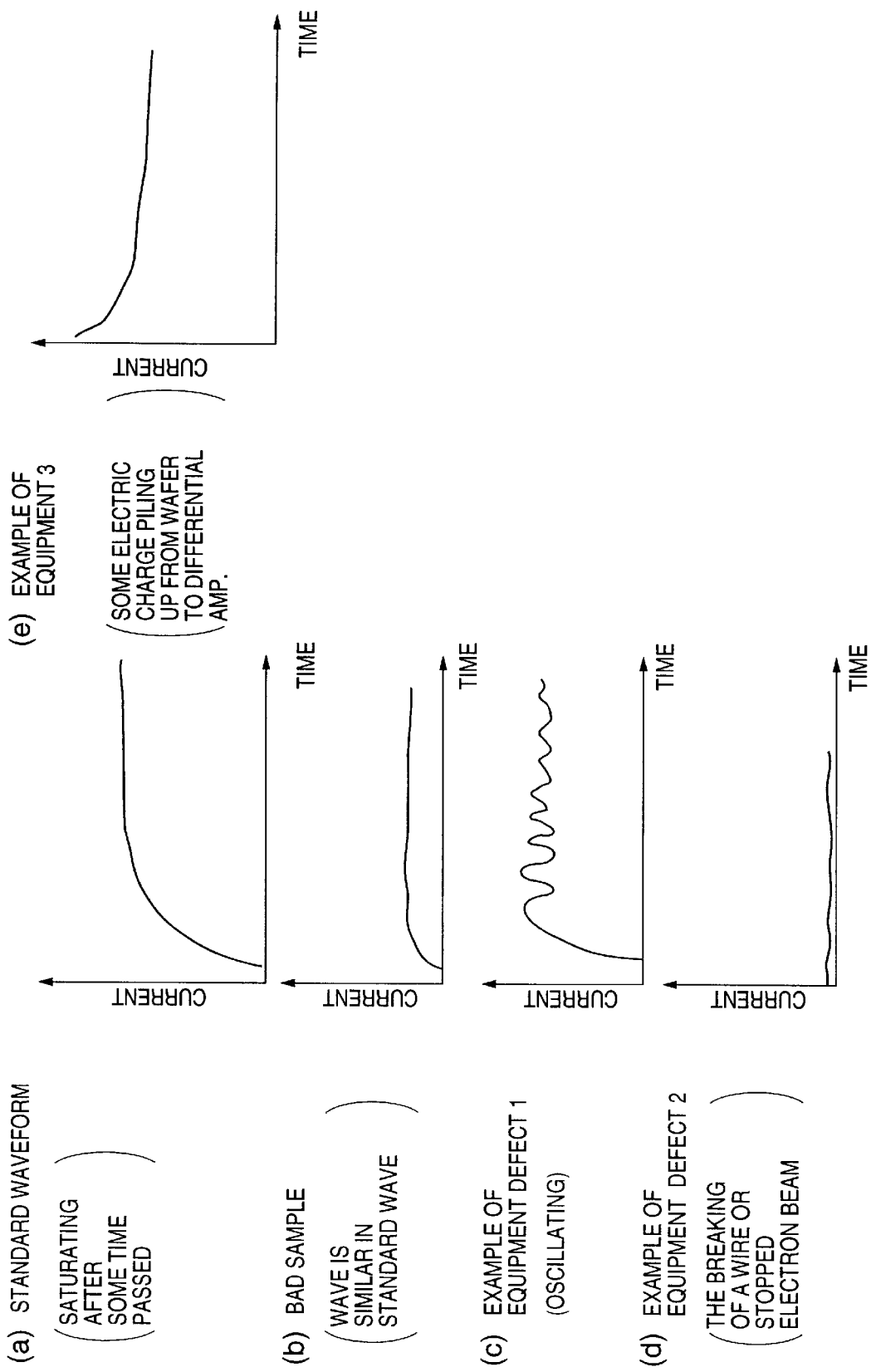
FIGS. 14(a) to (e) are a flowchart of a device inspection including a procedure for detecting a defect of equipment.

Referring to FIG. 13, there is shown a flow of a device inspection including a procedure for detecting a defect of equipment. In the example shown in FIG. 12, an error cause is determined on the basis of the current waveform obtained from the reference sample. In the example shown in FIG. 13, however, an error cause is determined by the measured current waveform itself. In other words, the measured current waveform has a specific pattern in overshoots at a rising edge or a falling edge of the waveform and in a subsequent transient waveform including a damped oscillation. This pattern is the same in a sample that has already been known to have a problem of defective etching. Therefore, the specific pattern is previously checked and the standard waveform is stored as shown in FIGS. 14(a) to 14(f) to compare it with a measured pattern such as, for example, the pattern shown in FIG. 14(b) (S21, S22). If a result of the comparison is within a predetermined range (S23), the measured data is stored (S24). If the result of the comparison exceeds the predetermined range in such a case that an overshoot is abnormally large or that an oscillation continues instead of a damped oscillation, for example, in a condition shown in FIG. 14(c), the equipment is determined to be defective and the measured data is discarded and an alarm is given (S25)

As compared patterns, there may be a rise time, an overshoot amount, an overshoot period, a flat period, an undershoot amount, an undershoot period, a zero-point offset, and a frequency analysis value of the waveform.

Figure 15:
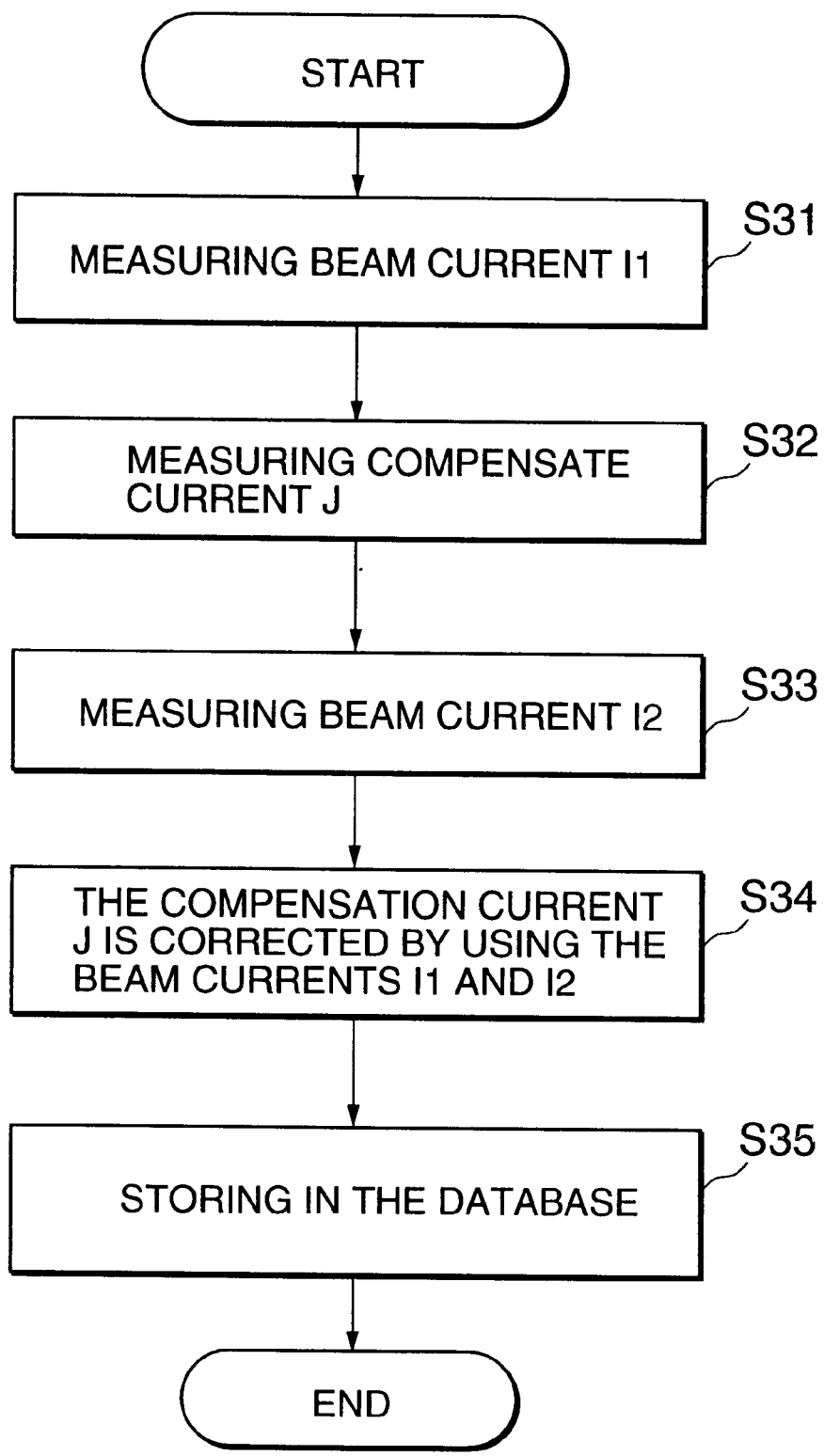
FIG. 15 is a flowchart of a device inspection in which a measurement is corrected by a current value of electron beams.

Referring to FIG. 15, there is shown a flow of a device inspection where a measurement precision is enhanced by correcting a measurement value by a current value of the electron beam. First, the Faraday cup 10 (See FIG. 7) representing one of a detector is arranged instead of the sample to be inspected 5 in a position irradiated with the electron beam and a beam current I1 is measured (S31). Subsequently, the Faraday cup 10 is removed from the beam irradiation position, the sample to be inspected 5 is irradiated with the electron beam, and a compensation current J is measured (S32). After the measurement, a beam current I2 is measured by using the Faraday cup 10 (S33). The compensation current J is corrected by using the beam currents I1 and I2 and the measurement value is standardized (S34). It is then stored in the database (S35).

The measurement with the electron beam is generally used a secondary electron microscope (SEM) or an electron beam exposing apparatus or their equivalents. Electron beam sources for these apparatuses are designed so as to operate very stably, by which a variation per day is only 1% or so, which is not a problem in a normal usage. If, however, a contact hole condition is checked by electron beam scanning, the current variation itself is about 1% and therefore an error occurs in a measurement value of the compensation current only by a weak fluctuation of the electron beam current.

As causes of the beam current fluctuation, there can be a temperature change of the beam source, deterioration with age of the beam source, a variation of power supplied to the beam source. These highly depend upon the apparatus and each apparatus needs to measure a beam current, to check the variation pattern or period, and to determine a correction function.

If the variation period of the beam current is long enough in comparison with the measurement time needed for a wafer, a beam current value is measured immediately before and after a start of the measurement as shown in FIG. 15, the measurement value of the compensation current is corrected on the assumption that their average or the beam current value changes with an elapse of time at a certain ratio. If the variation period of the beam current is very long and the value does not change almost at all during the measurement of the compensation current, the beam current may be measured only once for a single wafer or twice for a plurality of wafers at the beginning and the termination or once at either of them.

If the beam current largely fluctuates, the beam current is measured several times during the measurement of the compensation current and the measurement value of the compensation current is corrected based on the value.

Figure 16:
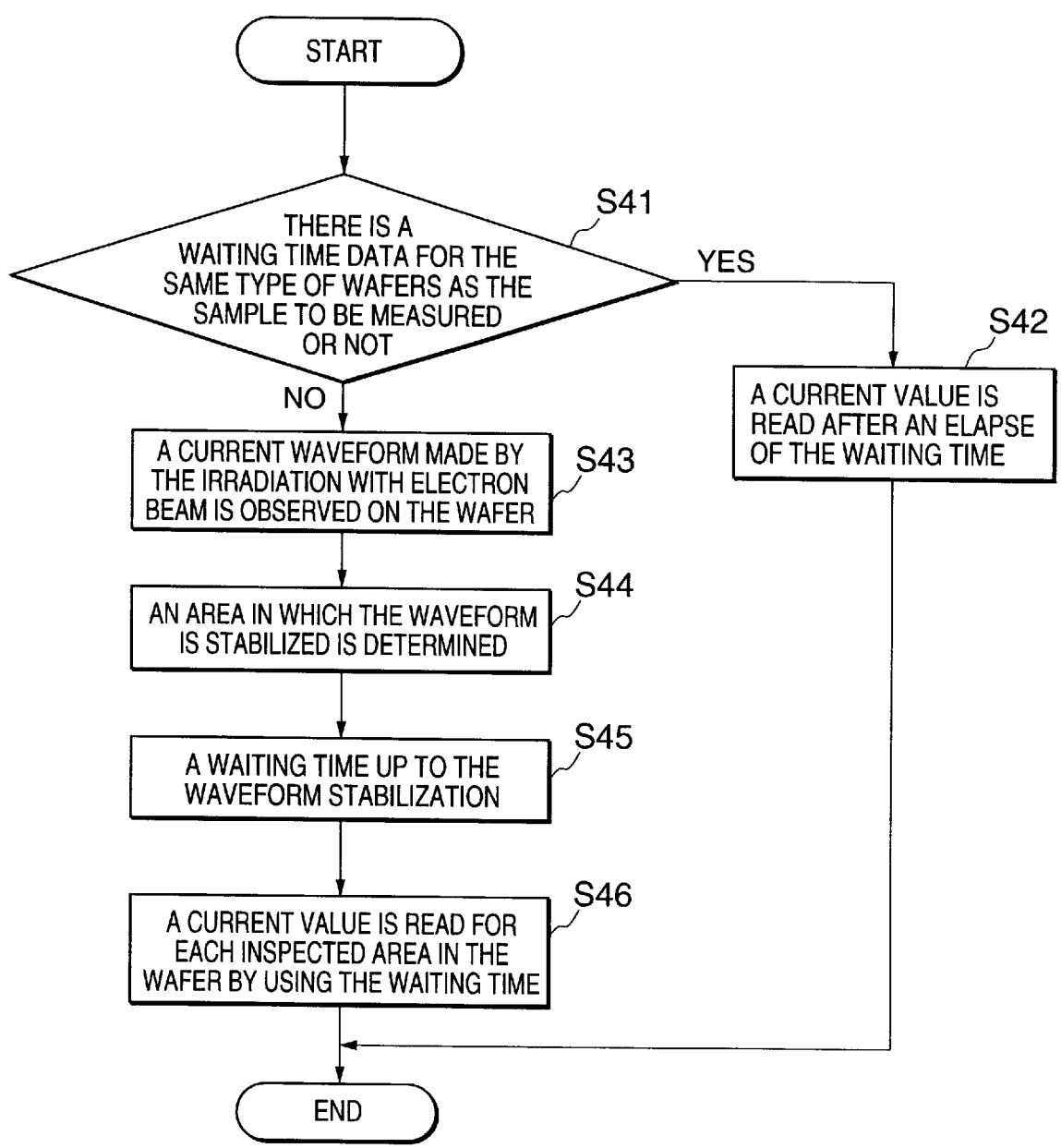
FIG. 16 is a flowchart of reading a current value.
Figure 17:
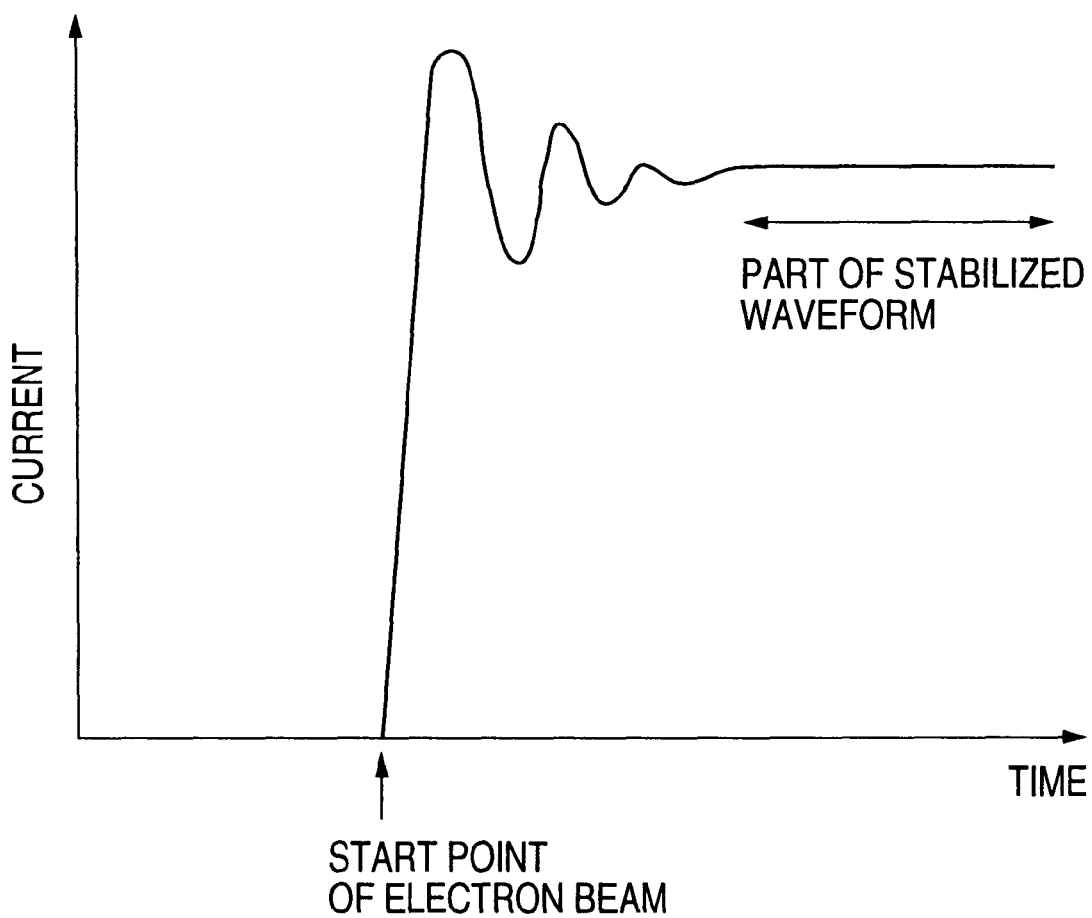
FIG. 17 is a diagram of assistance in explaining the timing for reading.

Referring to FIG. 16, there is shown a flow of reading a current value in the data processor 11. Referring to FIG. 17, there is shown a diagram of assistance in explaining timing for the reading.

When the compensation current is measured, an LCR value depends upon an apparatus or a wafer and therefore a response time of an obtainable waveform varies, thereby causing various time periods before a steady state. It takes much time only to analyze the response time for each wafer. On the other hand, although there are some differences according to response characteristics of the apparatus or the sample to be inspected, a flat portion is contained in a measurement from a rise of the waveform to some extent (1 sec or so), for example. Then, a current value of that portion is read and processed at the point of the data processing. This makes it possible to reduce a time period for setting measurement conditions.

For this purpose, a waveform after the irradiation with electron beams is previously observed for each type of wafers to find an area in which the waveform is considered to be stabilized, for example, an area in which the variation is within a range of ±5% from an average and a waiting time between the irradiation with electron beams and the current stabilization is stored. If there is a waiting time data for the same type of wafers as the sample to be measured (S41), it is used at an actual measurement and a current value is read after an elapse of the waiting time from the irradiation with electron beams in each inspected area (S42). Unless there is any waiting time data, a current waveform made by the irradiation with electron beams is observed on the wafer (S43), an area in which the waveform is stabilized is determined (S44), a waiting time up to the waveform stabilization is stored (S45), and a current value is read for each inspected area in the wafer by using the waiting time (S46).

If the wafer is of the same type, the LCR value is not so much different, thereby reducing a measurement time period by reusing a stored portion for a measurement.

As set forth hereinabove, the semiconductor device inspecting apparatus according to the present invention is capable of a high-precision nondestructive inspection with a reduction of external noises. Concretely, a value obtained from an area having no holes is used as a background value for a correction in a measurement of an average current, thereby removing an effect of a current generated in an area having no holes to enable an accurate measurement. In addition, by using a current differential input amplifier constitution for the current measurement, external noises are eliminated, thereby enabling an application of an offset voltage needed for the measurement. Furthermore, a measured current waveform is used for determining whether a defect of the device or of the equipment causes the result of the measurement, thereby improving reliability of a result of the inspection and enabling the defect of the equipment to be detected in an early stage. When a current value of electron beams is measured, the current can be measured at a high precision, by which an accurate hole diameter or film thickness can be obtained. The inspection time is reduced storing and reusing a waiting time up to a stabilization of the current measurement after the irradiation with electron beams.

What is claimed is:

1. A semiconductor device inspecting apparatus, comprising:

an electron gun for irradiating a area on a sample with electron beams to be inspected where a semiconductor device is formed;

an electron beam control section for controlling these electron beams;

current measuring equipment for measuring compensation current of secondary electrons generated by electron beams which have passed through contact holes in the inspected area and reached an underlying conductive layer;

a data processor for determining a reference for judging whether an inspected area is good or bad, which is a current value obtained by using said current measuring equipment when irradiating an area having one or more contact holes treated as the inspected area sequentially or collectively with electron beams; and a storage device for storing said data processing result, wherein said storage device stores a background value, which is a current value obtained when irradiating an area made of the same material and having the same structure except that it has no contact hole in the same sample as for the area having the contact holes in said inspected area and the data processor performs data processing of subtracting said background value stored in the storage device from the current value obtained by said current measuring equipment when irradiating said area having one or more contact holes treated as the inspected area.

2. A semiconductor device inspecting apparatus, comprising:

an electron gun for irradiating a area on a sample with electron beams to be inspected where a semiconductor device is formed;

current measuring equipment for measuring compensation current of secondary electrons generated by electron beams having reached an underlying conductive layer in said inspected area;

a data processor for determining a reference for judging whether an inspected area is good or bad, which is a current value obtained by using said current measuring equipment when irradiating an area having one or more contact holes treated as the inspected area sequentially or collectively with electron beams; and a storage device for storing said data processing result, wherein said current measuring equipment has a first current/voltage exchanger connected to an electrode on which the sample is placed, a second current/voltage exchanger connected to an opposite electrode arranged in the vicinity of the sample to be inspected, and a differential amplifier for determining a difference between a measurement value of said first current/voltage exchanger and a measurement value of said second current/voltage exchanger; and wherein the differential amplifier is connected to the data processor.

3. The apparatus according to claim 2, wherein said opposite electrode is a part of a cabinet for containing the sample to be inspected.

4. The apparatus according to claim 2, further comprising an electrode bias source for applying an electrode bias to a portion between said opposite electrode and said second current/voltage exchanger.

5. The apparatus according to claim 2, wherein a gain or an offset of said differential amplifier is externally settable.

6. A semiconductor device inspecting apparatus, comprising:

an electron gun for irradiating a area on a sample with electron beams to be inspected where a semiconductor device is formed;

an electron beam control section for controlling these electron beams;

current measuring equipment for measuring compensation current of secondary electrons generated by electron beams having reached an underlying conductive layer in said inspected area;

a data processor for determining a reference for judging whether an inspected area is good or bad, which is a current value obtained by using said current measuring equipment when irradiating an area having one or more contact holes treated as the inspected area sequentially or collectively with electron beams; and a storage device for storing said data processing result, wherein said data processor compares a current waveform obtained by using the current measuring equipment with a standard waveform previously stored in said storage device as a standard waveform when irradiating the predetermined area having one or more contact hole's on the semiconductor device with electron beams by using said electron gun and, if the comparison result exceeds the predetermined range, determines whether it is caused by a defect of the inspected area or of the inspecting apparatus.

7. The apparatus according to claim 6, wherein said data processor which determines the defect when the comparison result exceeds the predetermined range compares a current waveform obtained by using said current measuring equipment when irradiating a predetermined area having one or more contact holes on a standard sample which has obtained said standard waveform on said current measuring equipment with electron beams again with the standard waveform previously stored in said storage device as a standard waveform, determines a defect of the inspection apparatus if a result of the comparison exceeds the predetermined range or determines a defect of the semiconductor device to be inspected if a result of said comparison is within the predetermined range with giving an alarm on a display unit.

8. The apparatus according to claim 6, wherein said standard waveform previously stored in the storage device has a transient waveform pattern including overshoots at a rising edge and a falling edge of the waveform and a subsequent damped oscillation and wherein said data processor determines a defect of the apparatus when said comparison result exceeds the predetermined range.

9. The apparatus according to claim 6, wherein said standard waveform previously stored in the storage device has a pattern for a comparison in a rise time, an overshoot amount, an overshoot period, a flat period, an undershoot amount, an undershoot period, a zero-point offset, and a frequency analysis value of the waveform and wherein said data processor determines a defect of the apparatus when said comparison result exceeds the predetermined range.

10. A semiconductor device inspecting apparatus, comprising:

an electron gun for irradiating a area on a sample with electron beams to be inspected where a semiconductor device is formed;

an electron beam control section for controlling these electron beams;

current measuring equipment for measuring compensation current of secondary electrons generated by electron beams having reached an underlying conductive layer in said inspected area;

a data processor for determining a reference for judging whether an inspected area is good or bad, which is a current value obtained by using said current measuring equipment when irradiating an area having one or more contact holes treated as the inspected area sequentially or collectively with electron beams; and a storage device for storing said data processing result, wherein said storage device stores a current value of the electron beams having reached the inspected area from said electron gun for irradiating the electron beams by using a detector for a beam measurement of the current value; and wherein said data processor corrects the current value obtained by using said current measuring equipment when irradiating an area having one or more contact holes treated as the inspected area sequentially or collectively with electron beams on the basis of the measurement value of the beam measurement.

11. The apparatus according to claim 10, further comprising a detector arranged in an electron beam irradiation position instead of the sample to be inspected at one or more of the time points before, during, and after the inspection of the sample to be inspected where the semiconductor device is formed or before, during, or after the inspection of an individual inspected area on the sample to be inspected.

12. A semiconductor device inspecting apparatus, comprising:

an electron gun for irradiating a area on a sample with electron beams to be inspected where a semiconductor device is formed;

an electron beam control section for controlling these electron beams;

current measuring equipment for measuring compensation current of secondary electrons generated by electron beams having reached an underlying conductive layer in said inspected area;

a data processor for determining a reference for judging whether an inspected area is good or bad, which is a current value obtained by using said current measuring equipment when irradiating an area having one or more contact holes treated as the inspected area sequentially or collectively with electron beams; and a storage device for storing said data processing result, wherein said data processor reads and processes a current value in an area where the current is stabilized after the irradiation with the electron beams among measurement values obtained by using said current measuring equipment.

13. The apparatus according to claim 12, wherein said processor for reading and processing the current value in the area in which the current is stabilized after the irradiation with the electron beams among measurement values obtained by using said current measuring equipment comprises said storage device for storing a waiting time between the irradiation with the electron beams and the stabilization of the current and means for reading the current value after an elapse of the waiting time stored in said storage means after the irradiation with the electron beams.

* * * * *